United States Patent [19]

Katoh et al.

[11] Patent Number: 4,933,732
[45] Date of Patent: Jun. 12, 1990

[54] HETEROJUNCTION BIPOLAR TRANSISTOR

[75] Inventors: Riichi Katoh, Yokohama; Mamoru Kurata, Tokyo; Kouhei Morizuka, Yokohama, all of Japan

[73] Assignee: Kabushiki Kaisha Toshiba, Kawasaki, Japan

[21] Appl. No.: 214,058

[22] Filed: Jun. 30, 1988

[30] Foreign Application Priority Data

Jul. 2, 1987 [JP]  Japan ................................. 62-165861
Jun. 15, 1988 [JP]  Japan ................................. 63-147374

[51] Int. Cl.$^5$ ............................................. H01L 29/72
[52] U.S. Cl. ........................................... 357/34; 357/16; 357/58
[58] Field of Search ................... 357/34, 16, 58, 4, 90

[56] References Cited

U.S. PATENT DOCUMENTS 4,593,305  6/1986  Kurata et al. ....................... 357/34
4,750,025  6/1988  Chen et al. .......................... 357/34

OTHER PUBLICATIONS

A proposed Structure for Collector Transit-Time Reduction in AlGa/GaAs Bipolar Transistors; C. M. Maziar et al.: IEEE Electron Devices Lett., EAL-7, No. 8 (1986) p. 483.
GaAlAs/GaAs Heterojunction Microwave Bipolar Transistor; H. Geneking and L. M. Su; Electronics Letters, vol. 17, No. 8, (1981) p. 301.
Electronics Letters, vol. 19, No. 4, Feb. 1983, pp. 147–149, London, GB; D. Ankri et al.: "High-speed GaAlAs-GaAs Heterojunction Bipolar Transistors with Near-ballistic Operation", *Table 1; p. 148, col. 1, lines 9–18, p. 148, col. 2, lines 26–34; abstract*.
Electronics Letters, vol. 17, No. 8, Apr. 16, 1981, pp. 301–302, London, GB; H. Beneking et al.: "GaAlAs/GaAs Heterojunction Microwave Bipolar Transistor", *Abstract; FIG. 1; p. 301, col. 1*.
International Electron Devices Meeting, San Francisco, CA, Dec. 9–12, 1984, pp. 198–200, IEDM; S. Kofol et al.: "GaAs/AlGaAs Heterojunction Bipolar Transistors with Very Low Base Sheet Resistance", *Abstract; FIG. 1; paragraph 1*.

(List continued on next page.)

*Primary Examiner*—Andrew J. James
*Assistant Examiner*—Mark Prenty
*Attorney, Agent, or Firm*—Oblon, Spivak, McClelland, Maier & Neustadt

[57] ABSTRACT

A heterojunction bipolar transistor comprises a first semiconductor layer of a first conductivity type, a second semiconductor layer of the first conductivity type formed on the first semiconductor layer, a third semiconductor layer of a second conductivity type formed on the second semiconductor layer, the first, second and third semiconductor layers serving as a collector, a fourth semiconductor layer of the second conductivity type formed on the third semiconductor layer, the fourth semiconductor layer serving as a base, and a fifth semiconductor layer of the first conductivity type formed on the fourth semiconductor layer, the fifth semiconductor layer serving as an emitter, the fourth and fifth semiconductor layers together forming a heterojunction, and the fifth semiconductor layer having a larger band gap than the fourth semiconductor layer, wherein the first, second, third and fourth semiconductor layers are related as follows:

$$N_1 > N_2 \geqq N_3$$

$$N_3 < N_4$$

$$\left( \frac{2\epsilon V_{bi}}{e} \cdot \frac{N_2}{N_3(N_3 + N_2)} \right)^{\frac{1}{2}} < W_3$$

where $N_1$, $N_2$, $N_3$, and $N_4$ are impurity concentrations of the first, second, third, and fourth semiconductor layers, respectively, e is the unit charge, $\epsilon$ is the dielectric constant of the collector, $V_{bi}$ is the built-in potential between the second and third semiconductor layers, and $W_3$ is the thickness of the third semiconductor layer.

6 Claims, 16 Drawing Sheets

OTHER PUBLICATIONS

IEEE Electron Device Letters, vol. EDL-7, No. 8, Aug. 1986, pp. 483–485, IEEE, New York, U.S.; C. M. Maziar et al.: "A Proposed Structure for Collector Transit-Time Reduction in AlGaAs/GaAs Bipolar Transistors", *Abstract; FIG. 4; paragraph 3*.

IEEE Electron Device Letters, vol. EDL-5, No. 8, Aug. 1984, pp. 310–312, IEEE, New York, U.S.; P. M. Asbeck et al.: "GaAs/(Ga,Al)As Heterojunction Bipolar Transistors with Buried Oxygen-Implanted Isolation Layers", *Abstract; p. 310, col. 1, line 24–col. 2, line 19; FIG. 1*.

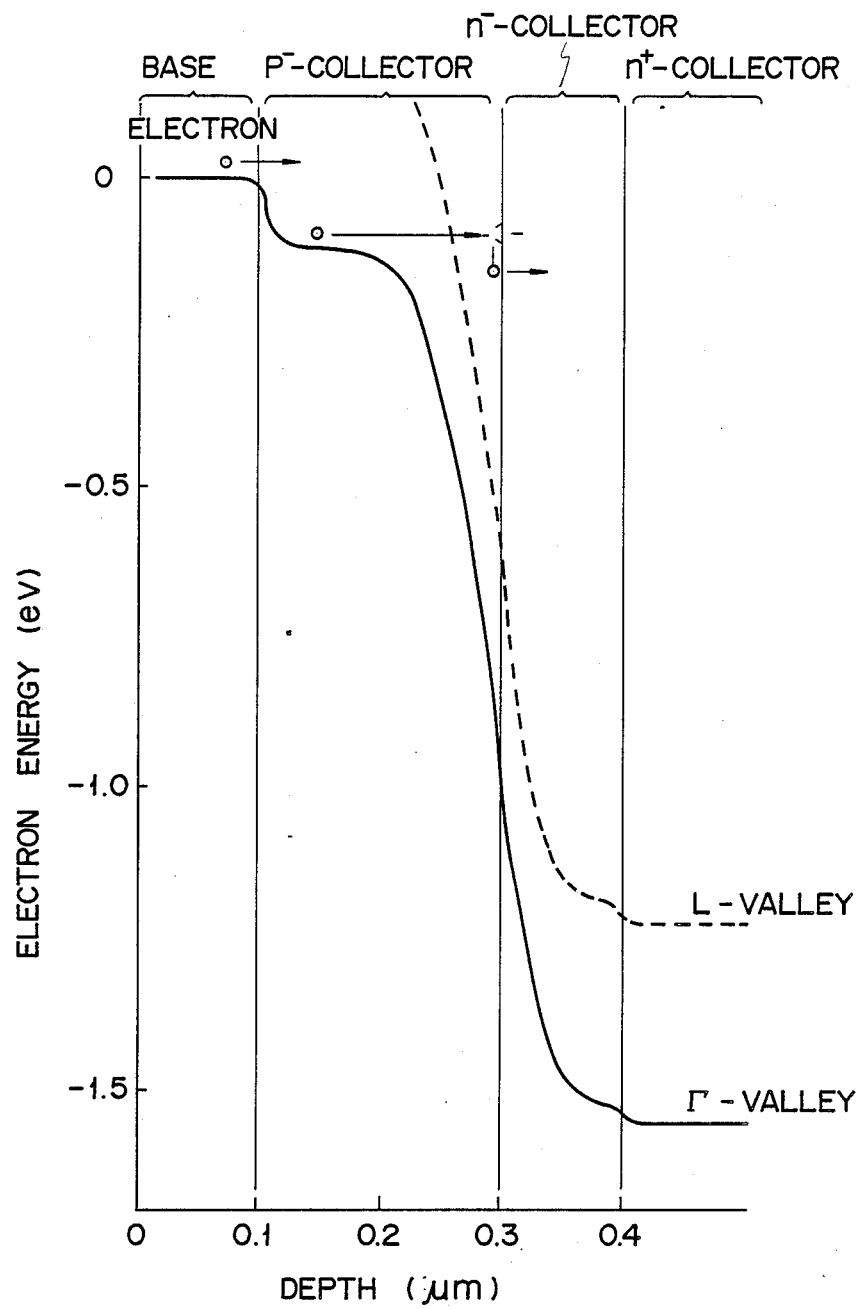
F I G. 4

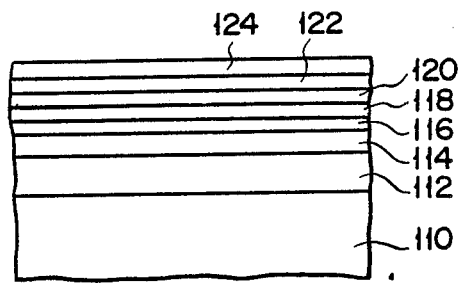
F I G. 7A
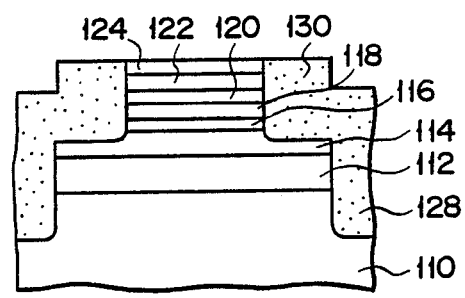
F I G. 7B
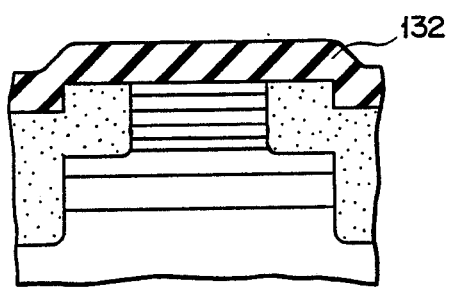
F I G. 7C
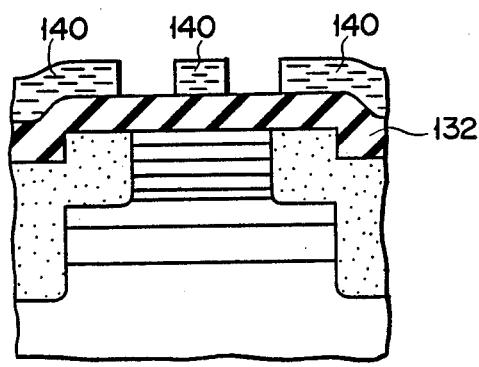
F I G. 7D

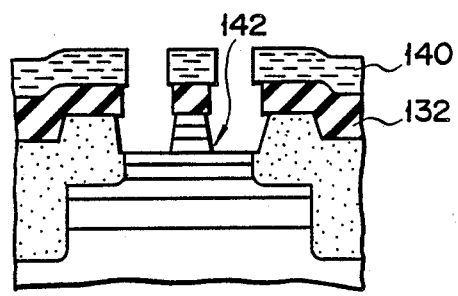
FIG. 7E
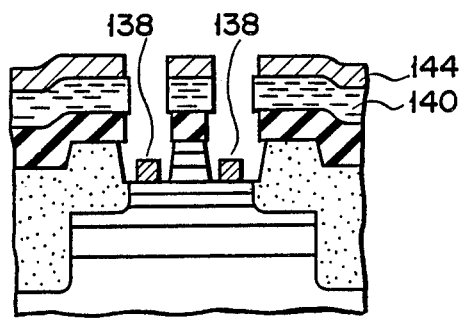
FIG. 7F
FIG. 7G
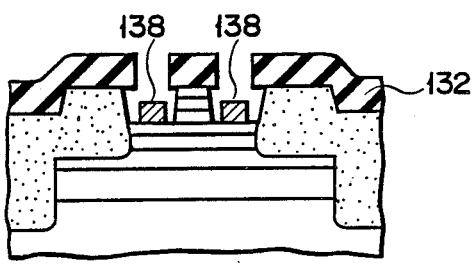
FIG. 7H
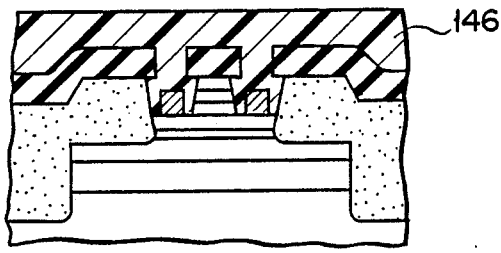
FIG. 7I

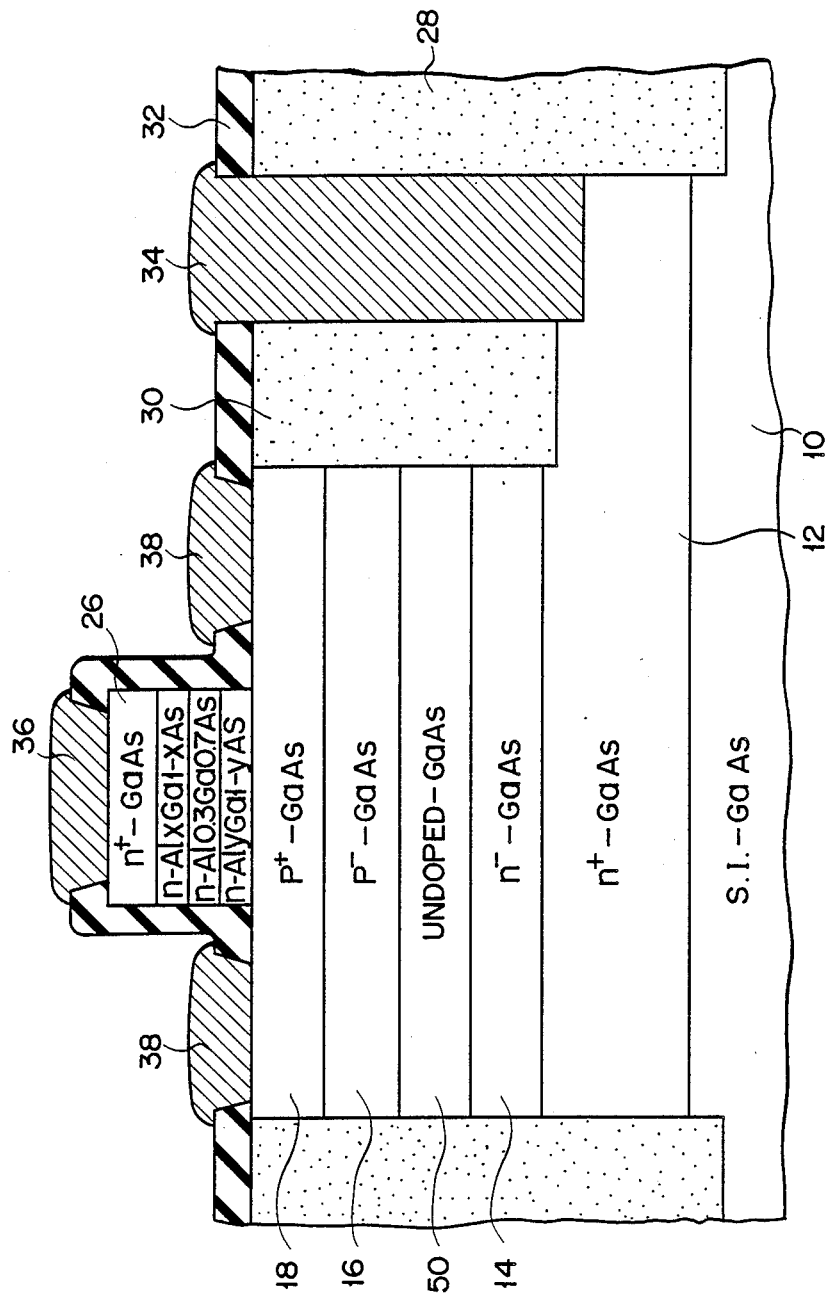
F I G. 12

HETEROJUNCTION BIPOLAR TRANSISTOR

BACKGROUND OF THE INVENTION

1. Field of the Invention

The present invention relates to a heterojunction bipolar transistor (HBT) using a semiconductor material for its emitter region, which is larger in band gap than that used for its base region.

2. Description of the Related Art

As a result of their excellent high-frequency and switching characteristics, heterojunction bipolar transistors are considered very promising as microwave transistors and high-speed logic transistors.

In general, the speed performance of bipolar transistors is represented by the cutoff frequency $f_T$. The cutoff frequency $f_T$ of npn transistors is represented by the reciprocal of the transit time of electrons in the transistors. Thus, to achieve a high cutoff frequency, it is necessary to reduce the electron transit time. The transit time $\tau$ of electrons in a transistor is given by the sum of an emitter-charging time $\tau_E$, a base transit time $\tau_B$, and a collector transit time and collector-charging time $\tau_C$. $\tau_B$ is independent of current density and is virtually constant, while $\tau_E$ decreases with increasing current density, and will be below 1 psec under the conditions of high current density in excess of $10^5$ A/cm².

In the case of $\tau_C$, on the other hand, the collector charging time, which is based on the collector junction capacitance, can be decreased sufficiently with an increase in the current density, but the collector transit time cannot sufficiently be decreased.

In particular, in the case of conventional general structures having p+(base)-n−(collector) junctions, electrons run through a depletion layer at a low saturation velocity of 6 to $8 \times 10^6$ cm/sec. Thus, if the depletion layer increases in width, then $\tau_C$ would almost simply increase in proportion to the width of the depletion layer. For this reason, $\tau_C$ would have the most effect on $f_T$.

Next, the collector transit time as explained above will now be described below in more detail.

FIG. 1 shows a conduction band in the base-collector region of a heterojunction bipolar transistor with a conventional structure of n emitter - p+ - n− collector - n+ collector. It should be noted that the conduction band refers to the $\Gamma$-valley. In the p+-n− junction, the conduction band abruptly bends at the interface between the base region and the collector region. In the drawing a dotted line denotes the L-valley. Electrons moving from the base region into the collector region instantly transmit from the $\Gamma$-valley to the L-valley by intervalley scattering therein. Because of the intervalley scattering the wave number vector has its direction disturbed, reducing the velocity of electrons.

In order to clarify the foregoing, the results of the calculations of electron-drift-velocity distribution, carried out by the present inventors using the Monte Carlo simulation, are shown in FIG. 2. As can be seen from FIG. 2, an overshoot of the electron velocity occurs near the base-collector junction. However, the distance within which the electrons are subject to the overshoot is below 500 Å. The electrons will run at a slow saturation speed of 6 to $7 \times 10^6$ cm/sec through the remainder of the depletion layer.

Various attempts have been made to reduce the collector transit time of electrons. One such attempt involves a structure in which a p− base is provided between a p+ base and an n+ collector ("A Proposed Structure for Collector Transmit-Time Reduction in AlGaAs/GaAs Bipolar Transistors"; C. M. Maziar et al. IEEE Electron Devices Lett. Vol. EDL-7, No. 8. 1986. p483). With this structure, to be sure, the velocity overshoot becomes easy to occur as compared with the conventional structures. Since the p−-n+junction corresponds to the p+-n− junction, however, the inclination of the conduction band will be made abrupt as shown in the conduction band diagram of FIG. 1 for conventional structures. Therefore, noticeable reduction of the collector transit time may not be expected. Furthermore, this structure has a disadvantage that breakdown voltage is low.

A heterojunction bipolar transistor with a structure of p+-p−(base)-n−-n+(collector) is disclosed in "GaAlAs/GaAs Hetero Junction Microwave Bipolar Transistor"; H. Beneking et al. Electronics Lett. Vol. 17, No. 8, 1981 p301. With this structure, since the p− base is completely depleted in operation of the transistor, and hence the conduction band diagram is similar to that of FIG. 1, the collector transit time of electrons will not be reduced.

With conventional heterojunction bipolar transistors, the velocity overshoot effects seen remarkably in compound semiconductors have hardly been employed usefully. The collector transit time would be governed by a slow saturation velocity in a high electric field region. Therefore, the merits of heterojunction bipolar transistors could not be used usefully in case that a collector depletion layer is large in width.

There is a physical quantity of maximum oscillation frequency $f_{MAX}$ to represent the speed performance of bipolar transistors. The maximum oscillation frequency can be described as $$f_{MAX} = (f_T/8\pi R_B C_C)^{\frac{1}{2}}$$

where $f_T$ stands for the cutoff frequency, $C_C$ the collector junction capacitance, and $R_B$ the base resistance.

To raise the maximum oscillation frequency $f_{MAX}$ it is necessary to raise the cutoff frequency $f_T$ and reduce the collector capacitance $C_C$. If the width of a depletion layer is increased in order to reduce the collector capacitance $C_C$, then the collector transit time will be increased and hence the cutoff frequency will be lowered. For this reason a technique is highly desired which enables the cut-off frequency and the maximum oscillation frequency to be raised while securing the desired width of the collector depletion layer.

SUMMARY OF THE INVENTION

It is an object of the present invention to provide a high speed heterojunction bipolar transistor in which the collector transit time of electrons is very short, and hence the cutoff frequency is very high.

It is another object of the present invention to provide a heterojunction bipolar transistor in which the collector capacitance is small, and hence the maximum oscillation frequency is very high.

It is still another object of the present invention to provide a heterojunction bipolar transistor which has a high breakdown voltage.

According to a first aspect of the present invention there is provided a first heterojunction bipolar transistor, comprising: a first semiconductor layer of a first conductivity type; a second semiconductor layer of the first conductivity type formed on the first semiconductor layer; a third semiconductor layer of a second conductivity type formed on the second semiconductor layer, the first, second and third semiconductor layers serving as a collector; a fourth semiconductor layer of the second conductivity type formed on the third semiconductor layer, the fourth semiconductor layer serving as a base; and a fifth semiconductor layer of the first conductivity type formed on the fourth semiconductor layer, the fifth semiconductor layer serving as an emitter, the fourth and fifth semiconductor layers together forming a heterojunction, and the fifth semiconductor layer having a larger band gap than the fourth semiconductor layer; wherein the first, second, third and fourth semiconductor layers are related as follows:

$$N_1 > N_2 \gtreqless N_3 \quad (1)$$

$$N_3 < N_4 \quad (2)$$

$$\left( \frac{2\epsilon V_{bi}}{e} \cdot \frac{N_2}{N_3(N_3 + N_2)} \right)^{\frac{1}{2}} < W_3 \quad (3)$$

where $N_1$, $N_2$, $N_3$, and $N_4$ are impurity concentrations of the first, second, third, and fourth semiconductor layers, respectively, e is the unit charge, $\epsilon$ is the dielectric constant of the collector, $V_{bi}$ is the built-in potential between the second and third semiconductor layers, and $W_3$ is the thickness of the third semiconductor layer.

According to the first heterojunction bipolar transistor, the collector is formed of three semiconductor layers, and one of the collector layers, which is formed next to the base layer, is formed of a low-impurity concentration semiconductor layer which is of the same conductivity type as the base layer, and cannot be completely depleted at zero bias, i.e., in thermal equilibrium.

In the first heterojunction bipolar transistor of this invention, a potential difference occurs between the base layer (fourth semiconductor layer) and the collector layer (third semiconductor layer) because the base and collector layers are related to each other as shown in expression (2). Because of the potential difference, electrons injected from the base layer into the collector layer are greatly accelerated, and are further accelerated as they pass through the collector layer. This is because the first through third semiconductor layers forming the collectors have the relationship represented by expression (1), the first and second semiconductor layers are of the same conductivity type, the second and third semiconductor layers of the opposite conductivity type, and hence the conduction band bends gently.

In the first heterojunction bipolar transistor of this invention, the third semiconductor layer must have the relationship represented by expression (3). The left-hand side of expression (3) represents the thickness of the depletion layer of the third semiconductor layer. The built-in potential $V_{bi}$ in expression (3) can be given by $$V_{bi} = \frac{kT}{e} \ln \left( \frac{N_3 N_2}{n i^2} \right) \quad (4)$$

where ni is the intrinsic carrier concentration. Expression (3) indicates that the third semiconductor layer is not completely depleted under the condition of thermal equilibrium condition. If the third semiconductor layer were completely depleted, the object of the present invention would not be attained. This is because complete depletion of the third semiconductor layer would result in a conduction band similar to that formed when the second and fourth semiconductor layers are directly joined together.

The action of the first heterojunction bipolar transistor of this invention will be described in detail by way of example of an npn transistor.

The overshoot effect of electron velocity is essentially derived from the band structure of a material. In compound semiconductors such as GaAs, the lowermost point of the conduction band is the $\Gamma$-valley in the (000) orientation, and the L-valley and the X-valley exist over the $\Gamma$-valley in the (111) orientation and in the (100) orientation, respectively. When an electron located at the bottom of the $\Gamma$-valley is accelerated by an electric field, it possesses sufficient kinetic energy for it to gain a high speed. When the electron energy exceeds the energy value corresponding to the minimum value of the L-valley or the X-valley, the electron will be scattered into either valley by means of the intervalley scattering. The intervalley scattering randomizes the direction of the wave number vector. Moreover, because the effective mass of an electron in the L-valley or the X-valley is heavier than that in $\Gamma$-valley the mean velocity of electrons will be small. That is to say, the velocity overshoot occurs in the $\Gamma$-valley which is smaller in energy than the X-valley and the L-valley, and thus where the electric field is large, in other words, where the inclination of the conduction band is abrupt, the distance needed to accelerate electrons would be shortened. Taking this point into account, the first heterojunction bipolar transistor is configured so that the conduction band inclines from the base region toward the collector region as gently as possible.

FIG. 4 shows the conduction band in the basecollector regions of the first heretojunction bipolar transistor of the present invention. Because of the potential drop between the p+ base layer and the p-collector layer, electrons injected from the base layer into the collector layer will be greatly accelerated. The p− layer sucks out the electrons injected from the base layer, thus serving as the collector. In the p− layer, the L-valley is far above the $\Gamma$-valley, and thus electrons will never cause the velocity saturation there. The electrons gained a high speed within the p− layer are then accelerated by the electric field based on the gentle inclination of the conduction band due to the p−-n− junction, getting again a high speed. Electrons are in the $\Gamma$-valley in almost all the regions where these electrons are accelerated, so that they can gain a high speed in almost the entire region of the collector. Owing to the configuration as described above, the collector transit time of electrons may be reduced to not more than half of that of the conventional transistors of the n− type collector structure.

FIG. 5 shows the result for the drift-velocity distribution of electrons in the first heterojunction bipolar transistor of this invention, calculated on the basis of the Monte Carlo simulation. The drift velocity takes an extremum at the junction of the p+ base layer and the p− collector layer, and takes a maximum value at the center of the p− layer. A comparison of FIG. 5 with FIG. 2, showing the drift velocity distribution in conventional heterojunction bipolar transistors, will reveal that electrons can gain a great drift velocity far exceeding the saturation velocity all over the collector depletion layer. As will be evident from the foregoing, the p− collector layer must not be completely depleted at least at zero bias. This is because, if the p⁻ layer is completely depleted, the conduction band will bend abruptly as in the case of conventional heterojunction bipolar transistors. If so, it will be difficult for the velocity overshoot advantageous to the heterojunction bipolar transistors to occur. Moreover, the p⁻-n⁻ junction serves to relax the electric field uniformly. This allows heterojunction bipolar transistors with a very high breakdown voltage to be fabricated.

As described above, according to the first heterojunction bipolar transistor, because the velocity overshoot effect of electrons in the collector layer can be employed most usefully, not only can the collector transit time be greatly shortened, but also a device with a very high breakdown voltage can be provided.

According to a second aspect of the present invention there is provided a second heterojunction bipolar transistor, comprising: a first semiconductor layer of a first conductivity type; a second semiconductor layer of the first conductivity type formed on the first semiconductor layer; a third semiconductor layer of a second conductivity type formed on the second semiconductor layer, the first, second and third semiconductor layers serving as a collector; a fourth semiconductor layer of the second conductivity type formed on the third semiconductor layer, the fourth semiconductor layer having an intrinsic base region serving as a base, and an external base region formed to surround the intrinsic base region; and a fifth semiconductor layer of the first conductivity type formed on the fourth semiconductor layer, the fifth semiconductor layer serving as an emitter, the fourth and fifth semiconductor layers together forming a heterojunction, and the fifth semiconductor layer having a larger band gap than the fourth semiconductor layer; wherein the second and third semiconductor layers formed below the external base region are formed to have high resistivity; and wherein the first, second, third and fourth semiconductor layers are related as follows:

$$N_1 > N_2 \geqq N_3 \quad (5)$$

$$N_3 < N_4$$

$$\left( \frac{2\epsilon V_{bi}}{e} \cdot \frac{N_2}{N_3(N_3 + N_2)} \right)^{\frac{1}{2}} < W_3$$

$$W_2 > W_3$$

where $N_1$, $N_2$, $N_3$, and $N_4$ are impurity concentrations of the first, second, third, and fourth semiconductor layers, respectively, e is the unit charge, $\epsilon$ is the dielectric constant of the collector, $V_{bi}$ is the built in potential between the second and third semiconductor layers, $W_2$ is the thickness of the second semiconductor layer, and $W_3$ is the thickness of the third semiconductor layer.

With the second heterojunction bipolar transistor, the relationship of expression (5) is required. The resistivity of the second and third semiconductor layers may be increased by crystal damage caused by ion implantation. The width of the collector depletion layer in the intrinsic transistor region except for the external base region is determined approximately by the thickness of the third semiconductor layer. By increasing the resistivity of the second and third semiconductor layers below the external base region, thus, it is possible to effectively reduce the collector capacitance. This will be described hereinafter.

The second semiconductor layer of the second heterojunction bipolar transistor can be set to such an impurity concentration that its resistivity may easily be increased by the use of ion implantation. With heterojunction bipolar transistors produced using the recent self-alignment technique, for example, the emitter width and the base electrode width can be formed at approximately equal minimum dimensions. In the case of a transistor in which base electrodes are provided on the both sides of the emitter, therefore, where the collector layer below the external base region is not increased in resistivity, the overall collector capacitance will be about three times the collector capacitance of the intrinsic transistor region. According to the second heterojunction bipolar transistor of this invention, the width of the collector depletion layer of the intrinsic transistor region is approximately equal to the thickness of the third semiconductor layer. Thus, if the second semiconductor layer were made in thickness three times the third semiconductor layer, and the second and third semiconductor layers below the external base region were increased in resistivity, then the overall collector capacitance would become about 1.5 times the collector capacitance of the intrinsic transistor region, that is, could be reduced to one-half that of the conventional heterojunction bipolar transistors.

According to a third aspect of the present invention there is provided a third heterojunction bipolar transistor, comprising: a first semiconductor layer of a first conductivity type; a second semiconductor layer of the first conductivity type formed on the first semiconductor layer; a third undoped semiconductor layer formed on the second semiconductor layer; a fourth semiconductor layer of a second conductivity type formed on the third semiconductor layer, the first, second, third and fourth semiconductor layers serving as a collector; a fifth semiconductor layer of the second conductivity type formed on the fourth semiconductor layer, the fifth semiconductor layer serving as a base; and a sixth semiconductor layer of the first conductivity formed on the fifth semiconductor layer, the fifth and sixth semiconductor layers forming together a heterojunction, and the sixth semiconductor layer being larger in band gap than the fifth semiconductor layer; wherein the first, second, fourth and fifth semiconductor layers are related as follows:

$N_1 > N_2$ $N_4 < N_5$ where $N_1$, $N_2$, $N_4$, and $N_5$ are impurity concentrations of the first, second, fourth, and fifth semiconductor layers, respectively.

With the third heterojunction bipolar transistor, the collector is comprised of four semiconductor layers. And, the third semiconductor layer of intrinsic semiconductor which is not doped with impurities is provided between the second and fourth semiconductor layers. The introducing of the third semiconductor layer will allow the shape of the conduction band in the collector to be more gently curved than in the p⁻-n⁻ collector structure. The electric field in the collector thus may be made gentle. Therefore, it is possible to lengthen the distance within which the velocity overshoot lasts. Furthermore, by introducing the third semiconductor layer it will be possible to widen the width of the collector depletion layer. As a result, the collector junction capacitance may be reduced.

The action of the third heterojunction semiconductor of this invention will be described by way of a heterojunction bipolar transistor having an n type emitter. When an n type emitter is used, the layer structure of the transistor results in p+(base)-p−(collector)-i(collector)-n−(collector)-n+(collector). The conduction band of the p−-i-n− structure has a more gentle inclination than that of the p−-n− structure. Consequently, the distance within which the velocity overshoot of electrons in the collector lasts will be lengthened. As a result the collector transit time of electrons may be shortened, and a high cutoff frequency may be obtained. Further, the reduction in the collector capacitance due to the introduction of the i layer will also allow an extremely high maximum oscillation frequency $f_{MAX}$ to be obtained.

BRIEF DESCRIPTION OF THE DRAWINGS

Other objects and advantages will be apparent from the following description taken in conjunction with the accompanying drawings in which:

FIG. 4 is the conduction-band diagram of the heterojunction bipolar transistor shown in FIG. 3;

FIGS. 7A through 7L show manufacturing processes for the modified transistor;

FIG. 12 is a cross sectional view of a heterojunction bipolar transistor according to a third embodiment of this invention.

DETAILED DESCRIPTION OF THE PREFERRED EMBODIMENTS

The preferred embodiments of the present invention will be described hereinafter.

Figure 3:
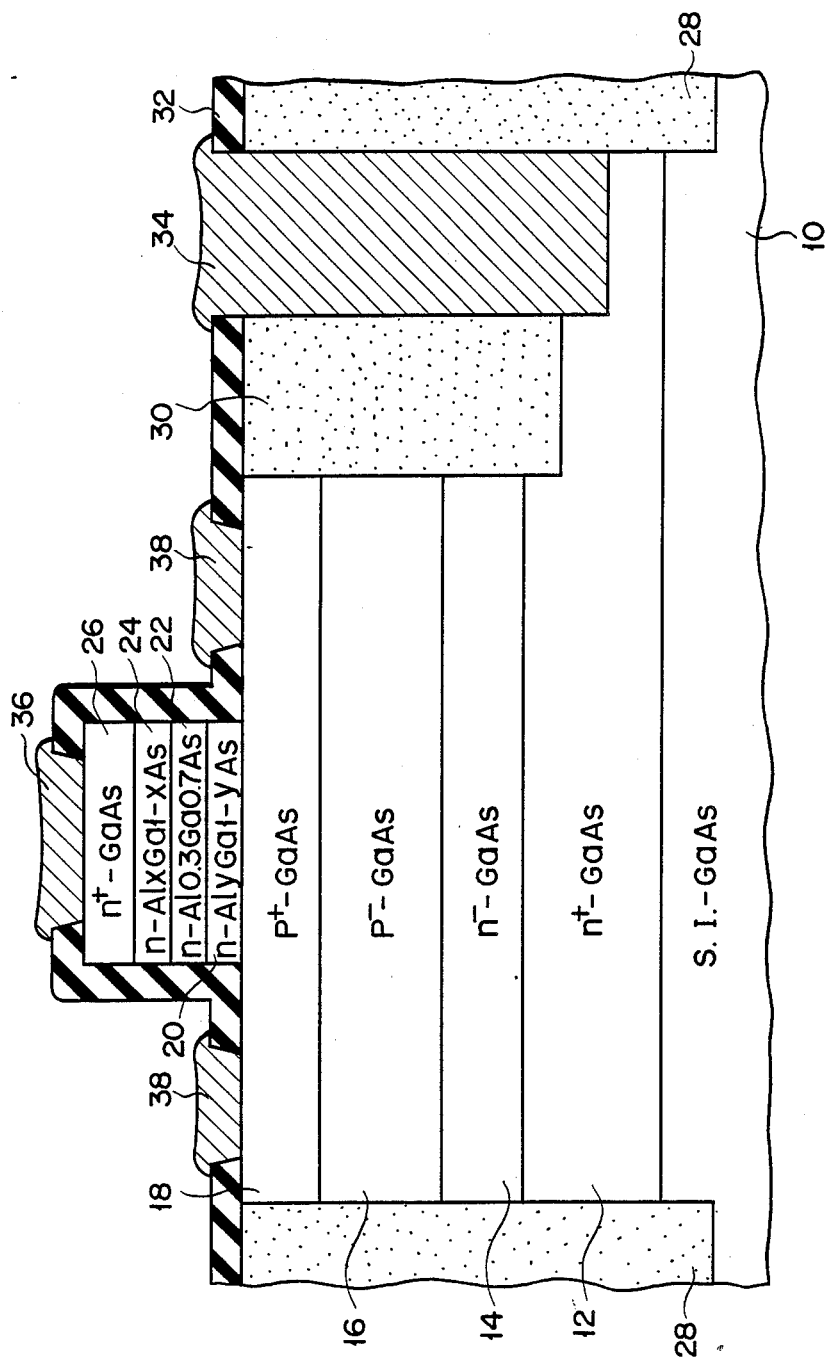
FIG. 3 shows a cross section of a heterojunction bipolar transistor according to first embodiment of this invention.

FIG. 3 shows a sectional view of a heterojunction bipolar transistor of AlGaAs/GaAs basis according to a first embodiment of this invention. To manufacture the transistor it is necessary to grow semiconductor layers sequentially on a semi-insulating GaAs 10 substrate by means of epitaxial growth.

As the epitaxial growth technique, molecular beam epitaxy (MBE) or metal organic chemical vapor deposition (MOCVD) may be used. The specific manufacturing conditions will be described in the order of process.

First, an n+ type GaAs layer 12 of Si-impurity concentration of $2 \times 10^{18}$ cm$^{-3}$, and 5000 Å thickness is epitaxially grown on semi-insulating GaAs substrate 10. An n− type GaAs layer 14 of impurity concentration of $2 \times 10^{17}$ cm$^{-3}$ and thickness of 1000 Å is grown on layer 12. A p− type GaAs layer 16 of Be-impurity concentration of $1 \times 10^{17}$ cm$^{-3}$ is grown on layer 14 at a thickness of 2000 Å. A p+ type GaAs layer 18 of impurity concentration of $1 \times 10^{19}$ cm$^{-3}$ and thickness of 1000 Å is grown on layer 16. It is to be noted that layers 12, 14 and 16 serve as collector region, and layer 18 serves as a base region. An n type Al$_Y$Ga$_{1-31 Y}$As layer 20 ($0 \leq Y \leq 0.3$) of Si-impurity concentration of $3 \times 10^{17}$ cm$^{-3}$ and 500 Å thickness is grown on layer 18. An n type Al$_{0.3}$Ga$_{0.7}$As layer 22 of impurity concentration of $3 \times 10^{17}$ cm$^{-3}$ and 1000 Å thickness is grown onto layer 20. An n type Al$_X$Ga$_{1-X}$As layer 24 ($0.3 > X > 0$) of impurity concentration of $3 \times 10^{17}$ cm$^{-3}$ and 500 Å thickness is grown on layer 22. An n+ type GaAs layer 26 of impurity concentration of $2 \times 10^{18}$ cm$^{-3}$ and thickness of 1000 Å is grown on layer 24.

Al$_Y$Ga$_{1-Y}$As layer 20 is provided for varying the band gap at the heterojunction interface smoothly, and Y increases with position toward the top of the layer. Thus, the composition of layer 20 varies gradually. Al$_X$Ga$_{1-X}$As layer 24 is also provided for the same purpose, but X decreases with position toward the top of the layer. Layers 20, 22 and 24 serve as emitter region, and layer 26 serves as an emitter-cap layer.

Using the thus formed epitaxial wafer, first, device-isolation insulating layers 28 reaching substrate 10 are formed by implantation of H+ions, and electrode-isolation insulating layers 30 reaching n+ type GaAs layer 12 within the transistor are formed by implantation of B+ions. Using a predetermined mask, the semiconductor layers 20, 22, 24, 26 are selectively etched up to a depth to reach p+ type GaAs layer 18, thus exposing the base. Subsequently a CVDSiO$_2$ layer 32 is formed over the entire surface. To provide an electrode contact to the collector region, selective etching is carried out from the wafer surface to a depth to reach layer 12. A thin layer of AuGe is formed in the etched portion, and a layer of Au is then formed on the AuGe layer to provide a collector electrode 34. Further, contact holes are formed for the emitter and base regions to provide emitter and base electrodes 36 and 38 of AuGe layer.

Figure 1:
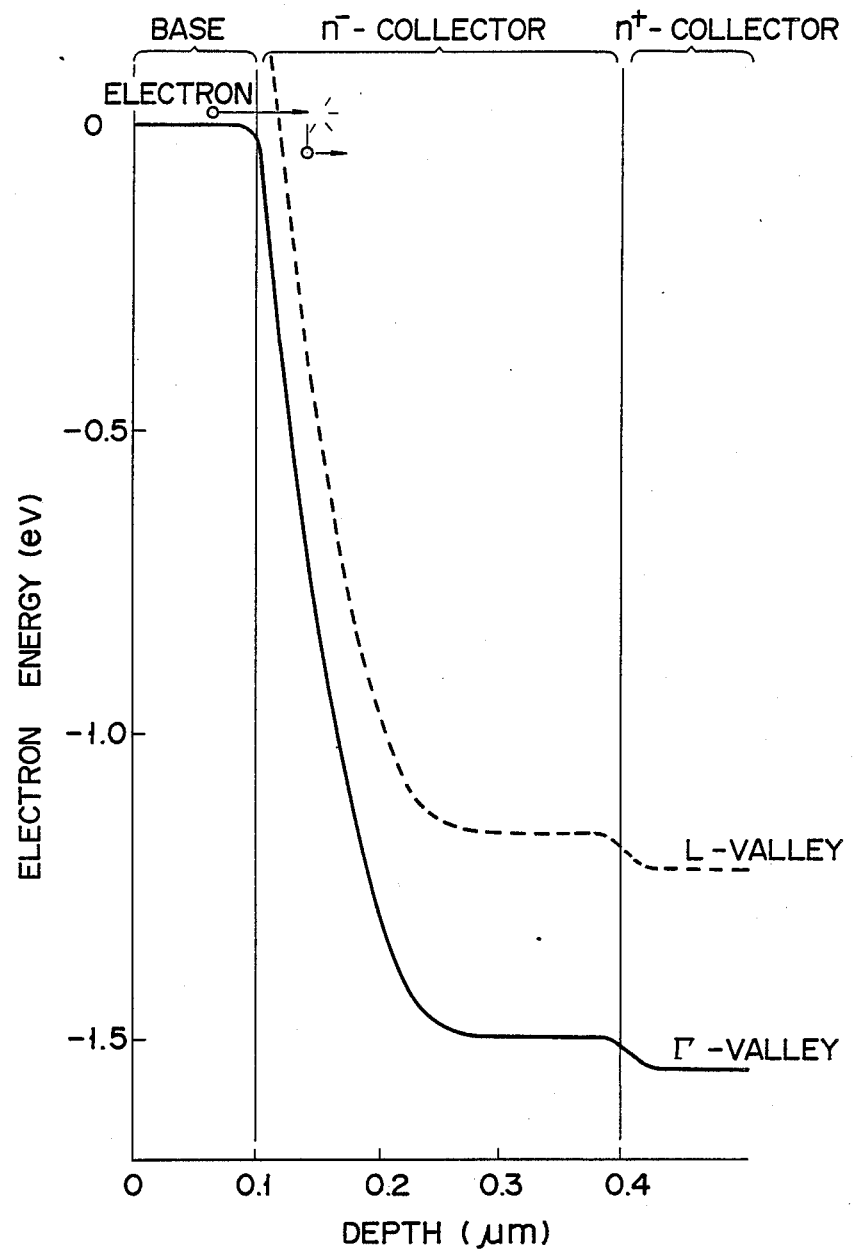
FIG. 1 is a conduction-band diagram of a conventional heterojunction bipolar transistor.
Figure 2:
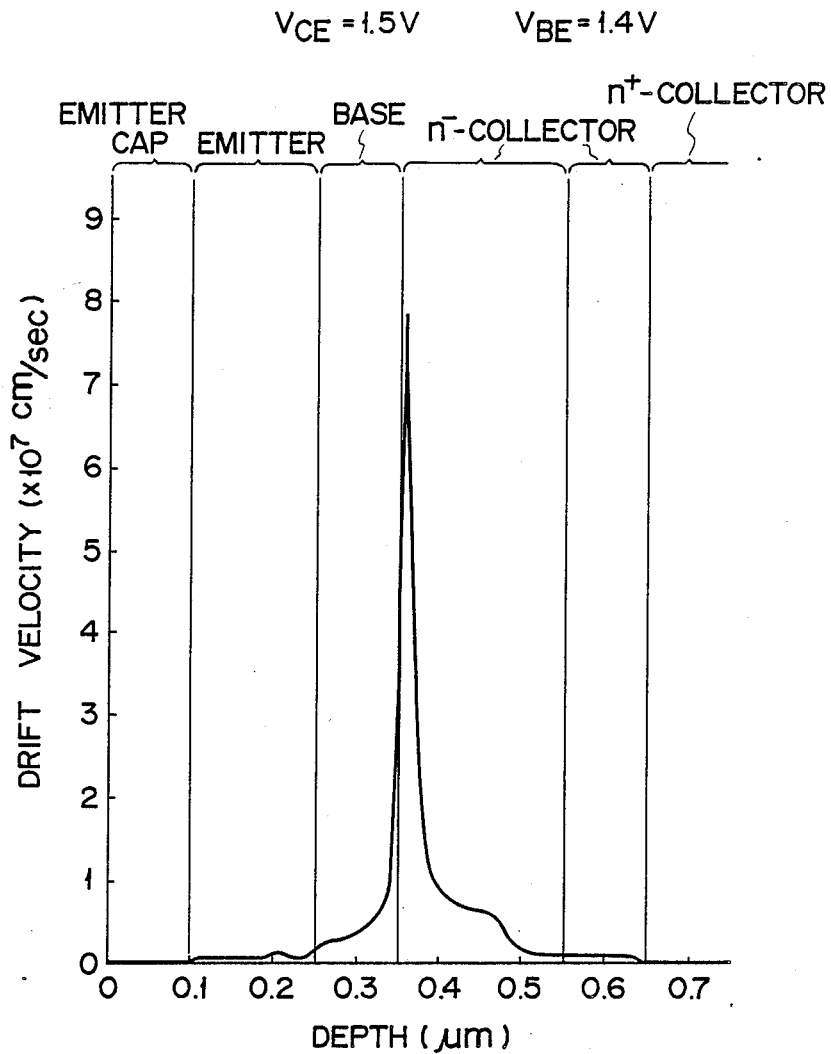
FIG. 2 shows the distribution of drift velocities of electrons in the conventional heterojunction bipolar transistor.
Figure 5:
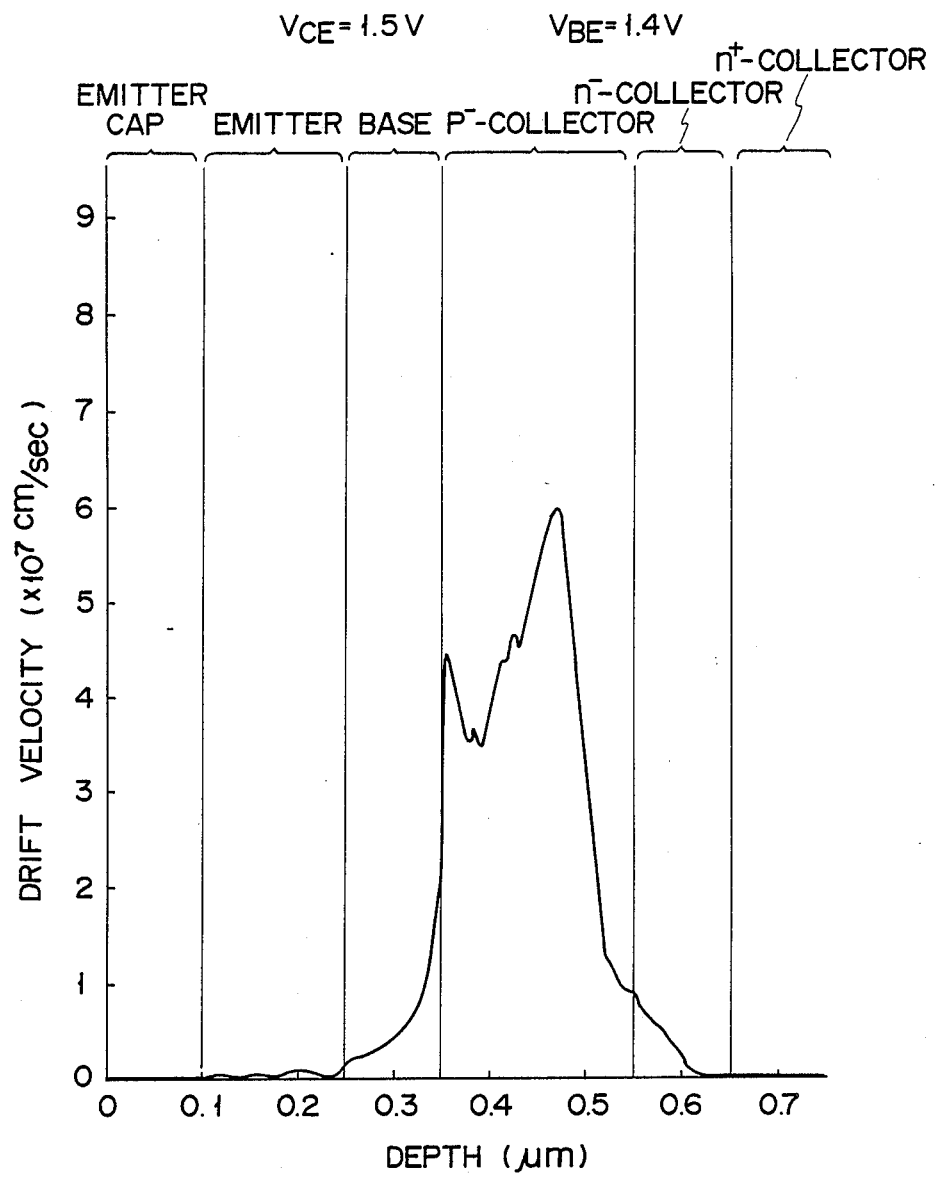
FIG. 5 shows the distribution of drift velocities of electrons in the heterojunction transistor of FIG. 3.

FIG. 5 shows the drift velocity distribution obtained by means of the Monte Carlo simulation for a transistor having substantially the same structure as the heterojunction bipolar transistor fabricated as described above. The operational condition is VCE=1.5 V, $V_{BE}$=1.4 V. By comparing this with FIG. 2 showing the conventional drift velocity distribution it w 11 be noted that the collector transit time is improved by over 30% and hence results in a value of about 0.7 psec.

The first embodiment is described in terms of the AlGaAs/GaAs heterojunction bipolar transistor. The present invention is also applicable to heterojunction bipolar transistors using a different combination of semiconductor materials. With the first embodiment, the p− type collector layer is formed to have a uniform impurity concentration. Alternatively, the layer may be formed to have an impurity-concentration gradient. In addition, in the p+ type base, the semiconductor composition may be varied to bend the band gap or to have an impurity-concentration gradient. Further, if the collector region is made long enough to increase the breakdown voltage, then high-speed and high-breakdown-voltage devices may be provided.

Figure 6:
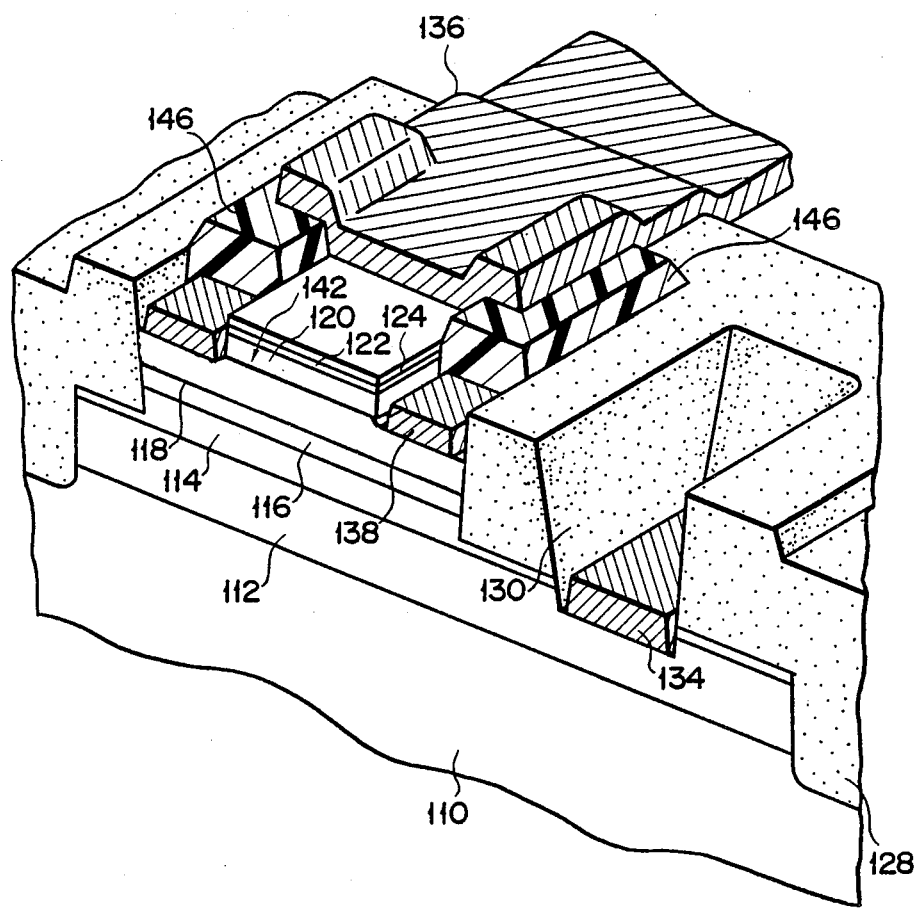
FIG. 6 is a perspective view of a heterojunction bipolar transistor according to a modification of the first embodiment of this invention.

Next, a description will be given of an experiment which was performed to investigate differences between characteristics of a heterojunction bipolar transistor having the $n^-$-$n^+$ collector structure and a hetero-junction bipolar transistor having $p^-$-$n^-$-$n^+$ collector structure of this invention. A heterojunction bipolar transistor of this invention shown in FIG. 6 is fabricated as follows.

As shown in FIG. 7A, a collector layer 112 of $n^+$ type GaAs of thickness 0.5 $\mu$m, a collector layer 114 of $n^-$ type GaAs of carrier concentration $2 \times 10^{17}$ cm$^{-3}$ and thickness 0.35 $\mu$m, a collector layer 116 of $p^-$ type GaAs of carrier concentration $7 \times 10^{16}$ cm$^{-3}$ and thickness 0.15 $\mu$m, a base layer 118 of $p^+$ type AlGaAs of carrier concentration $1 \times 10^{19}$ cm$^{-3}$ and thickness 0.1 $\mu$m, an emitter layer 120 of $n^-$ type Al$_{0.3}$Ga$_{0.7}$As of carrier concentration $5 \times 10^{17}$ cm$^{-3}$ and thickness 0.1 $\mu$m, a layer 122 of $n^+$ type AlGaInAs of carrier concentration $1 \times 10^{19}$ cm$^{-3}$ and thickness 0.05 $\mu$m, and a layer 124 of $n^-$ type In$_{0.5}$Ga$_{0.5}$As of carrier concentration $1 \times 10^{19}$ cm$^{-3}$ and thickness 0.05 $\mu$m are in sequence grown over a semi-insulating GaAs substrate 110 by means of MBE. The composition of layer 122 is such that it stepwise varies from the composition of layer 120 to that of layer 124. To this end, Al and Ga are decreased, while In is increased. The composition of Al in base layer 118 is selected to be 0.1 on the side of emitter and to be 0 on the side of collector. Such a structure may accelerate electrons within the base, reducing the base transit time of electrons.

As shown in FIG. 7B, next, a high-resistivity layer 128 adapted for device isolation, and a high-resistivity layer 130 for isolation between base and collector are formed by proton implantation. At this time, portions of layers 122, 124 are etched away using a mask material, e.g., polyimide, used for forming high-resistivity layer 128 as an etching mask. Removing the portions of layers 122, 124 by etching is due to the fact that, since these layers have narrow band gaps, they cannot be increased in resistivity by proton implantation.

Subsequently, as shown in FIG. 7C, an SiO$_2$ layer 132 is deposited on the whole surface of wafer at a thickness of 0.5 $\mu$m by CVD. As shown in FIG. 7D, by using photoresist a base-electrode-forming mask 140 is formed on SiO$_2$ layer 132. As shown in FIG. 7E, using mask 140, SiO$_2$ layer 132 is etched by RIE. The side-etching of SiO$_2$ layer 132 is performed by wet etching.

As shown in FIG. 7F, base layer 118 is exposed by selective wet-etching of layers 124, 122, 120 using mask 140 and SiO$_2$ layer 132 for masks. Emitter region 142 is formed by this step.

Next, as shown in FIG. 7G, an alloy layer 144 of AuZn is deposited onto the whole surface of wafer. As shown in FIG. 7H, photoresist mask 140 is melted away, and the pattern of base electrode 138 is formed by the lift off technique. As described in FIGS. 7E and 7F, SiO$_2$ layer 132 and emitter region 142 have been side-etched with respect to photoresist layer 140 and SiO$_2$ layer 132, respectively. Thus, the spacing between emitter region 142 and base electrode 138 is determined by amounts of the side-etching. Therefore, the spacing can be in the range about 0.1 $\mu$m to 0.2 $\mu$m.

Figure 7J:
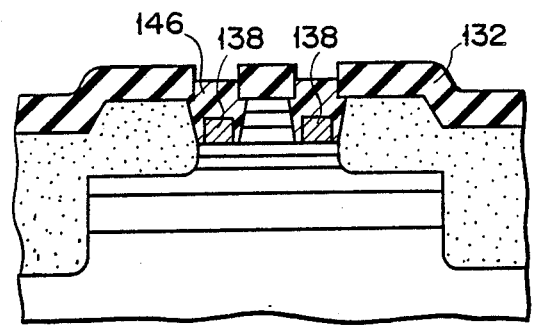

As shown in FIG. 7I, the whole surface of wafer is next coated with a prepolymer solution of polyimide resin by spin coating, and then the wafer is stepwise heated up to 320° C. to form a layer 146 of polyimide resin. As shown in FIG. 7J, polyimide resin layer 146 is etched in a plasma using a mixed gas of oxygen and CF$_4$ until SiO$_2$ layer 132 is exposed. Since the prepolymer solution has viscosity, the surface of polyimide resin layer 146 is made flat. Thus, polyimide resin layer 146 remains on the base electrode.

Figure 7K:
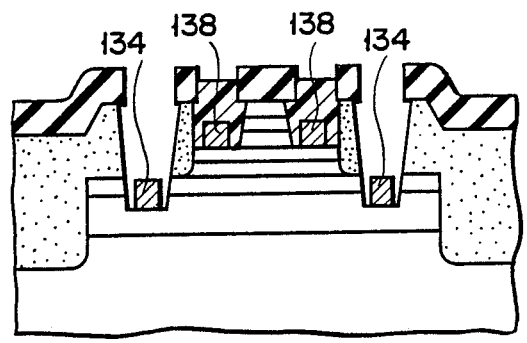

Subsequently, to remove the natural oxide film on the surface of layer 124, the surfaces of layers 124, 146 are treated by ammonium fluoride. Next, as shown in FIG. 7K, a collector electrode 134 of an alloy of AuGeNi is formed in the same manner as described in FIGS. 7F to 7H. By heating to 360° C. in argon gas, AuZn of base electrode 138 and AuGeNi of collector electrode 134 are each alloyed with GaAs to provide ohmic contacts.

Figure 7L:
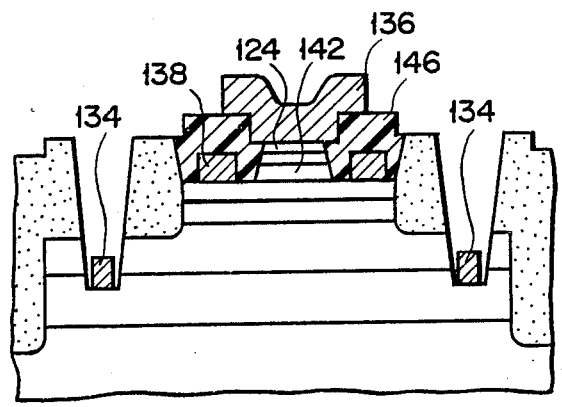

Next, SiO$_2$ layer 132 is solubilized by a mixed solution of ammonium fluoride and hydrofluoric acid to expose emitter region 124. As shown in FIG. 7L, an emitter contact 136 of Ti/Pt/Au is formed on the exposed emitter region 124 by the lift off technique. Emitter electrode 136 is made 0.5 $\mu$m larger than emitter region 142. Emitter region 142 is surrounded with polyimide resin film 146. This can avoid a short between emitter electrode 136 and base electrode 138. In addition, alignment allowance of emitter electrode 136 is provided outside the emitter region 142, so that the emitter width may be reduced independent of the alignment allowance. Thus, in this embodiment, the emitter width is formed at 1 $\mu$m. The width of the base electrode 138 is 1 $\mu$m. Thus, base/collector width can considerably be reduced. In this manner the heterojunction bipolar transistor is fabricated.

A heterojunction bipolar transistor with the $n^-$-$n^+$ type collector structure is produced by substituting $n^-$ type GaAs collector layer 114 and $p^-$ type GaAs collector layer 116 with an $n^-$ type GaAs collector layer of impurity concentration of $5 \times 10^{16}$ cm$^{-3}$ and thickness of 0.5 $\mu$m.

Figure 8:
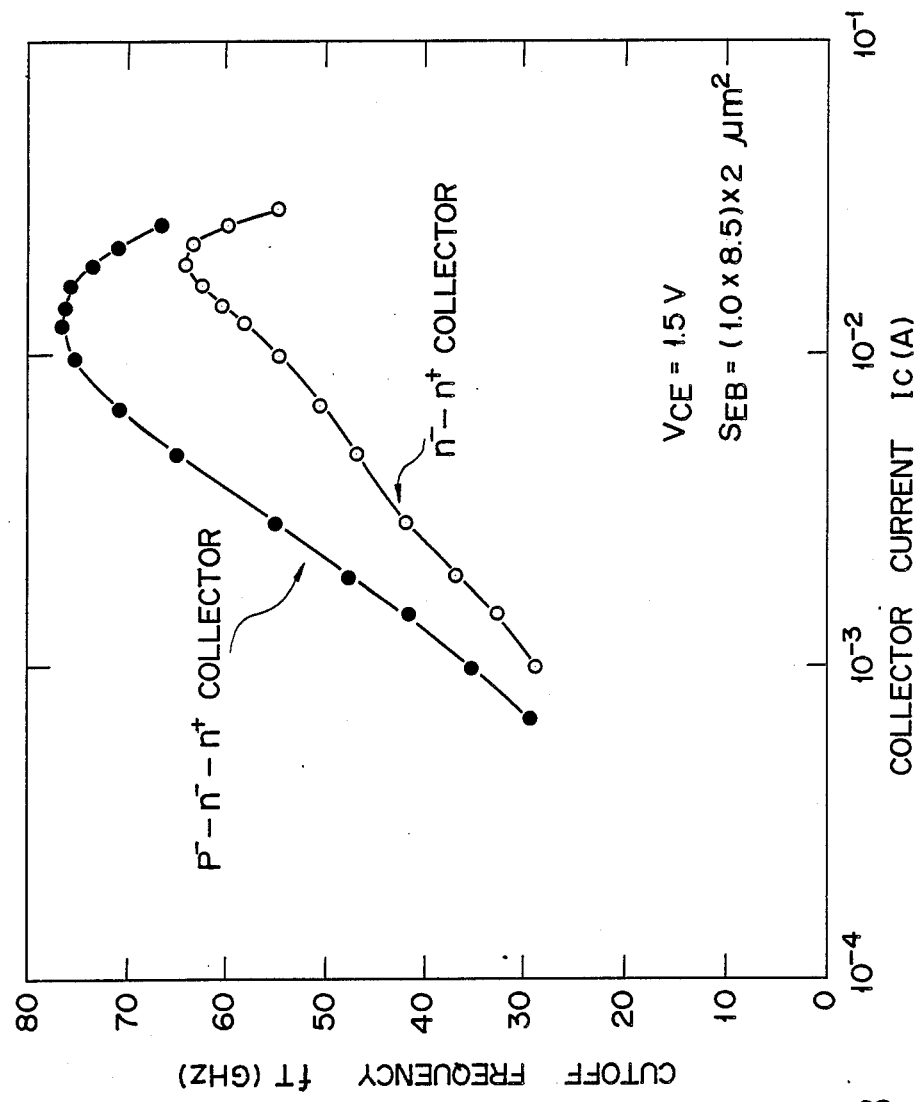
FIG. 8 shows a relationship between collector current an cutoff frequency.

In this way, two types of a heterojunction bipolar transistor whose emitter has two fingers SEB each having a finger size of 1.0 $\mu$m$\times$8.5 $\mu$m, and which has a base-collector junction area of 6.0 $\mu$m$\times$8.5 $\mu$m were fabricated. The first type of transistor has the $n^-$-$n^+$ type collector structure, while the second type has the $p^-$-$n^-$-$n^+$ type collector structure according to this invention. The S parameters of these transistors were measured and the cut-off frequencies $f_T$ were compared. The results are shown in FIG. 8. As can been seen from FIG. 8, in the case of the transistor of $n^-$-$n^+$ type collector structure, the cut-off frequency is 55 GHz, while, in the transistor of this invention, the cutoff frequency is raised to as high as 76 GHz. During these measurements, the collector-emitter voltage was set to 1.5 V. Thus, the width of the collector depletion layer is about 0.2 $\mu$m for both the transistors. The base and emitter structures are also common to the transistors. Therefore, it was confirmed that the improvement of the cutoff frequency $f_T$ of the transistor of this invention was due to the reduction in the collector transit time based on the velocity overshoot effect. The collector breakdown voltage BV$_{CEO}$ of the heterojunction bipolar transistor of this invention is 13 V. This is sufficiently high. The effectiveness of this invention for an improvement in breakdown voltage could also be confirmed.

A heterojunction bipolar transistor according to a second embodiment of this invention will be described with reference to FIGS. 9, 10A through 10L, and 11.

Figure 10A:
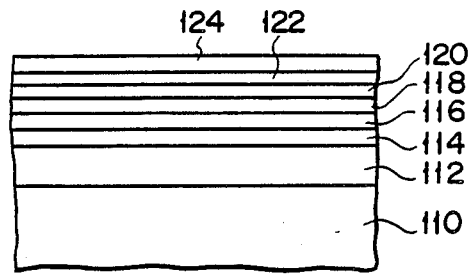
FIGS. 10A through 10L show manufacturing processes for the heterojunction bipolar transistor of the second embodiment.

As shown in FIG. 10A, a collector layer 112 of n+ type GaAs of thickness 0.5 μm, a collector layer 114 of n− type GaAs of carrier concentration $2\times10^{17}$ cm$^{-3}$ and thickness 0.45 μm, a collector layer 116 of p− type GaAs of carrier concentration $7\times10^{16}$ cm$^{-3}$ and thickness 0.15 μm, a base layer 118 of p+ type AlGaAs of carrier concentration $2\times10^{19}$ cm$^{-3}$ and thickness 0.1 μm, an emitter layer 120 of n− type Al$_{0.3}$Ga$_{0.7}$As of carrier concentration $5\times10^{17}$ cm$^{-3}$ and thickness 0.1 μm, a layer 122 of n+ type AlGaInAs of carrier concentration $1\times10^{19}$ cm$^{-3}$ and thickness 0.05 μm, and a layer 124 of n− type In$_{0.5}$Ga$_{0.5}$As of carrier concentration $1\times10^{19}$ cm$^{-3}$ and thickness 0.05 μm are in sequence grown over a semi-insulating GaAs substrate 110 by means of MBE. The composition of layer 122 is such that it stepwise varies from the composition of layer 120 to that of layer 124. To this end, Al and Ga are decreased, while In is increased. The composition of Al in base layer 118 is selected to be 0.1 on the side of emitter and to be 0 on the side of collector. Such a structure may accelerate electrons within the base, reducing the base transit time of electrons.

Figure 10B:
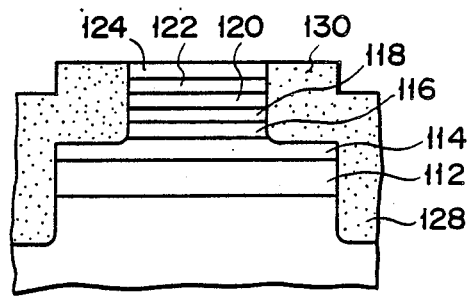

As shown in FIG. 10B, next, a high-resistivity layer 128 adopted for device isolation, and a high- o resistivity layer 130 for isolation between base and collector are formed by proton implantation. At this time, portions of layers 122, 124 are etched away using a mask material, e.g., polyimide, used for forming high-resistivity layer 128 as an etching mask. Removing the portions of layers 122, 124 by etching is due to the fact that, since these layers have narrow band gaps, they cannot be increased in resistivity by proton implantation.

Figure 10C:
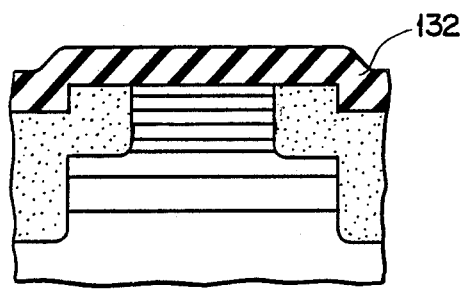
Figure 10D:
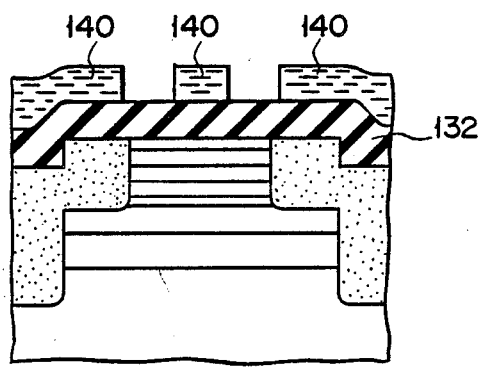
Figure 10E:
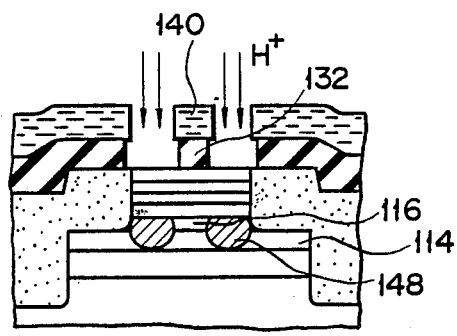

Next, as shown in FIG. 10C, an SiO$_2$ layer 132 is deposited on the whole surface of wafer at a thickness of 0.5 μm by CVD. As shown in FIG. 10D, by using photoresist a base-electrode-forming mask 140 is formed on SiO$_2$ layer 132. As shown in FIG. 10E, using mask 140, SiO$_2$ layer 132 is etched by RIE. The side-etching of SiO$_2$ layer 132 is performed by wet etching. Furthermore, by being irradiated with protons under conditions of an accelerating voltage of 110 KeV and an injection amount of $2\times10^{13}$ cm-2 through photoresist mask 140 and SiO$_2$ layer 132 used as masks, high-resistivity regions 148 are formed in p− GaAs collector region 116 and n− GaAs collector region 114 below the external base region.

Figure 10F:
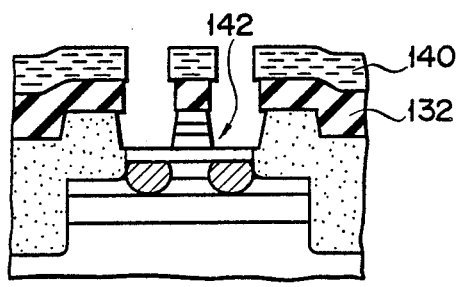

As shown in FIG. 10F, base layer 118 is exposed by selective wet-etching of layers 124, 122, 120 using mask 140 and SiO$_2$ layer 132 for masks. Emitter region 142 is formed by this step.

Figure 10G:
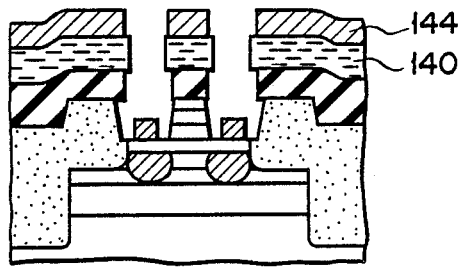
Figure 10H:
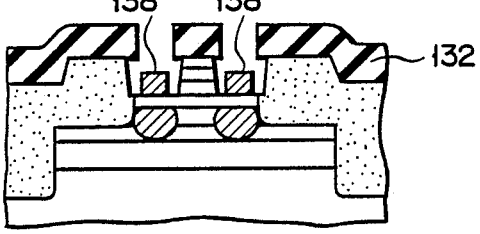

Next, as shown in FIG. 10G, an alloy layer 144 of AuZn is deposited onto the whole surface of wafer. As shown in FIG. 10H, photoresist mask 140 is melted away, and the pattern of base electrode 138 is formed by the lift off technique. As described in FIGS. 10E and 10F, SiO$_2$ layer 132 and emitter region 142 have been side-etched with respect to photoresist layer 140 and SiO$_2$ layer 132, respectively. Thus, the spacing between emitter region 142 and base electrode 138 is determined by amounts of the side-etching. Therefore, the spacing can be in the range about 0.1 μm to 0.2 μm.

Figure 10I:
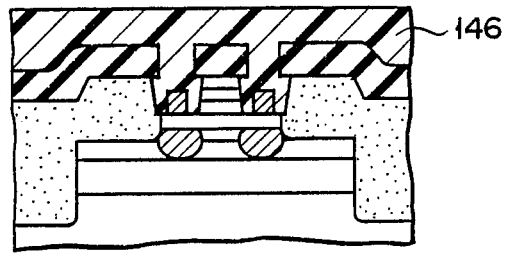
Figure 10J:
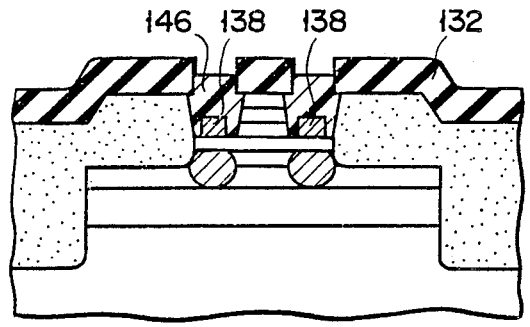

As shown in FIG. 10I, the whole surface of wafer is next coated with a prepolymer solution of polyimide resin by spin coating, and then the wafer is stepwise heated up to 320° C. to form a layer 146 of polyimide resin. As shown in FIG. 10J, polyimide resin layer 146 is etched in a plasma using a mixed gas of oxygen and CF$_4$ until SiO$_2$ layer 132 is exposed. Since the prepolymer solution has viscosity, the surface of polyimide resin layer 146 is made flat. Thus, polyimide resin layer 146 remains on the base electrode.

Figure 10K:
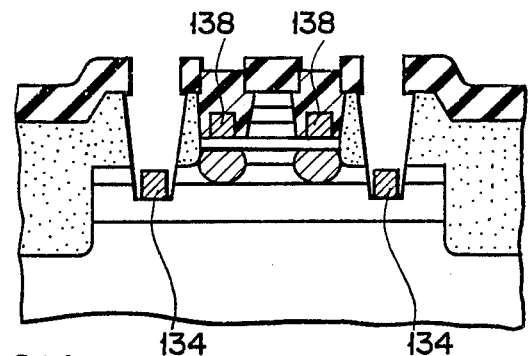

Subsequently, to remove the natural oxide film on the surface of layer 124, the surfaces of layers 124, 146 are treated by ammonium fluoride. Next, as shown in FIG. 10K, a collector electrode 134 of an alloy of AuGeNi is formed in the same manner as described in FIGS. 10F to 10H. By heating to 360° C. in argon gas, AuZn of base electrode 138 and AuGeNi of collector electrode 134 are each alloyed with GaAs to provide ohmic contacts.

Figure 9:
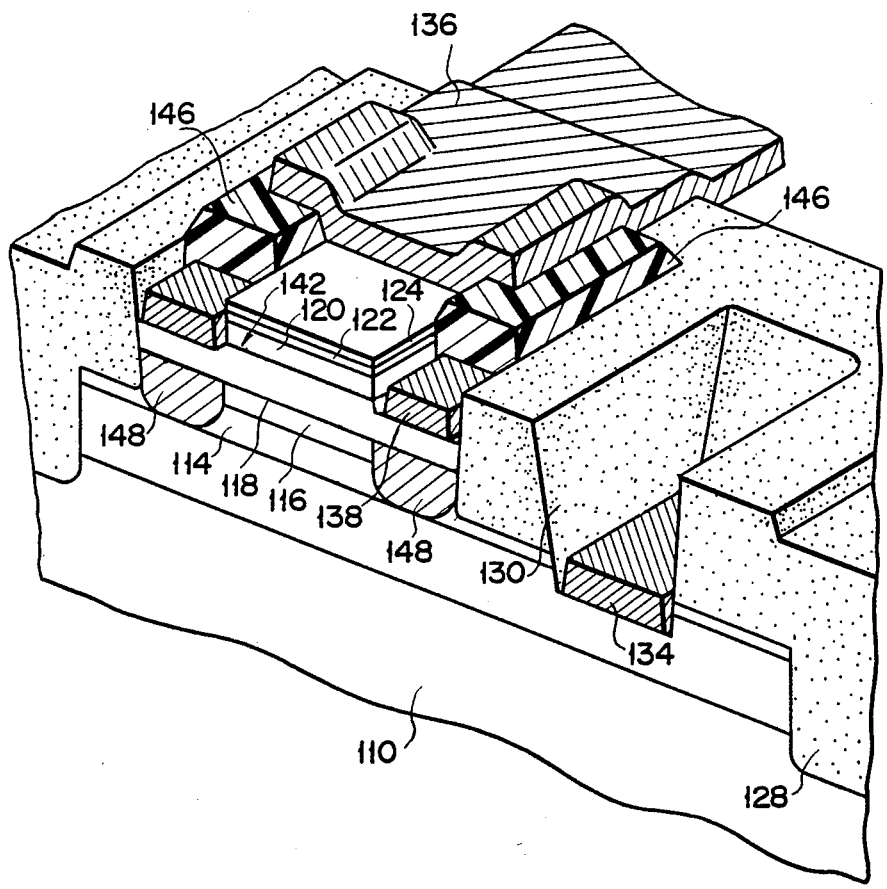
FIG. 9 is a perspective view of the heterojunction bipolar transistor according to a second embodiment of this invention.
Figure 10L:
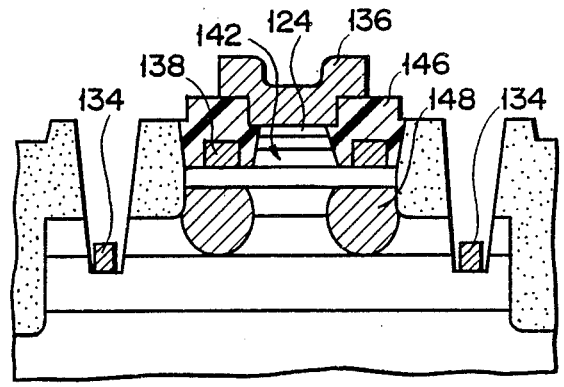

Next, SiO$_2$ layer 132 is solubilized by a mixed solution of ammonium fluoride and hydrofluoric acid to expose emitter region 124. As shown in FIG. 10L, an emitter contact 136 of Ti/Pt/Au is formed on the exposed emitter region 124 by the lift off technique. Emitter electrode 136 is made 0.5 μm larger than emitter region 142. Emitter region 142 is surrounded with polyimide resin layer 146. This can avoid a short between emitter electrode 136 and base electrode 138. In addition, alignment allowance of emitter electrode 136 is provided outside the emitter region 142, so that the emitter width may be reduced independent of the alignment allowance. As a consequence, in this embodiment, the emitter width is formed at 1 μm. The width of the base electrode is 1 μm. Thus, base/collector width can considerably be reduced. In this manner the hetero-junction bipolar transistor shown in FIG. 9 is fabricated.

Figure 11:
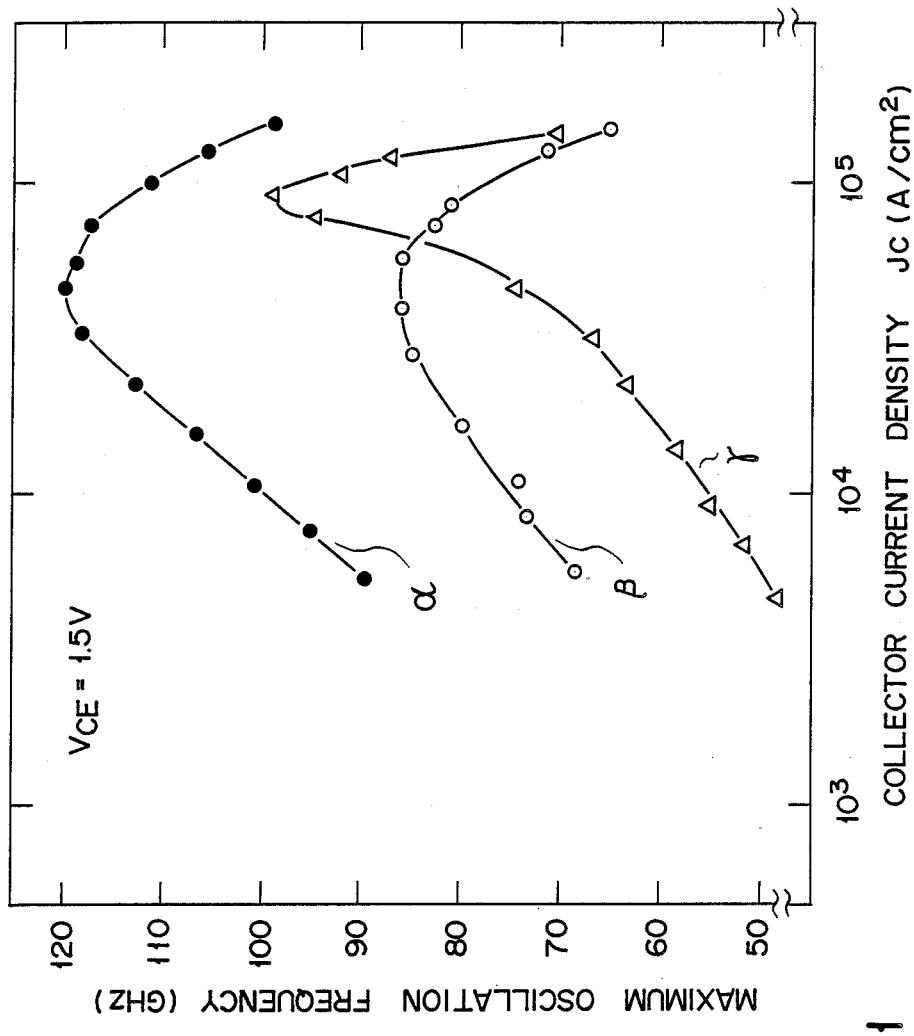
FIG. 11 shows a relationship between collector current density and maximum oscillation frequency.

In this way, a heterojunction bipolar transistor whose emitter has two fingers SEB of 1.0 μm×8.5 μm and which has a base-collector junction area of 6.0 μm×8.5 μm were fabricated. The maximum oscillation frequency $f_{MAX}$ was found from the measurement of S parameter. Further, a heterojunction bipolar transistor having the n−-n+ type collector structure consisting of GaAs, and another heterojunction bipolar transistor having the same wafer structure as the third embodiment as described later, but involves no high resistivity region 148 were also fabricated. Their maximum oscillation frequencies $f_{MAX}$ were also found. The results are shown in FIG. 11. The curve α represents the characteristics of the heterojunction bipolar transistor according to the third embodiment, the curve β those of the heterojunction bipolar transistor with no high-resistivity region, and the curve γ those of the transistor having the n−-n+ type collector structure. In the transistor of this embodiment, the cut-off frequency $f_T$ is high, and the collector capacitance is small as compared with other transistors, so that the maximum oscillation frequency becomes most high. The value is as high as 120 GHz.

A heterojunction bipolar transistor according to the third embodiment of this invention will be described with reference to FIG. 12. First, an n+ type GaAs layer 12 of Si-impurity concentration of $2\times10^{18}$ cm$^{-3}$, and 5000 Å thickness is formed on semi-insulating GaAs substrate 10 by epitaxial growth. An n− type GaAs layer 14 of impurity concentration of $2\times10^{17}$ cm$^{-3}$ and thickness of 1500 Å is grown on layer 12. A high-purified GaAs layer 50 of 500 Å thickness is formed on layer 14 by epitaxial growth. A p− type GaAs layer 16 of Be-impurity concentration of $1\times10^{17}$ cm$^{-3}$ is grown on layer 50 at a thickness of 1500 Å. A p+ type GaAs layer 18 of impurity concentration of $1\times10^{19}$ cm$^{-3}$ and thickness of 1000 Å is grown on layer 16. It is to be noted that layers 12, 14, 50 and 16 serve as a collector region, and layer 18 serves as a base region. An n type Al$_Y$Ga$_{1-Y}$As layer 20 (0<Y<0.3) of Si-impurity concentration of $3\times 10^{17}$ cm$^{-3}$ and 500 Å thickness is grown on layer 18. An n type Al$_{0.3}$Ga$_{0.7}$As layer 22 of impurity concentration of $3\times 10^{17}$ cm$^{-3}$ and 1000 Å thickness is grown on layer 20. An n type Al$_X$Ga$_{1-X}$As layer 24 (0.3>X>0) of impurity concentration of $3\times 10^{17}$ cm$^{-3}$ and 500 Å thickness is grown on layer 22. An n+ type GaAs layer 26 of impurity concentration of $2\times 10^{18}$ cm$^{-3}$ and thickness of 1000 Å is grown on layer 12.

Al$_Y$Ga$_{1-Y}$As layer 20 is provided for varying the band gap at the heterojunction interface smoothly, and Y increases with position toward the top of the layer. Thus, the composition of layer 20 varies gradually. Al$_X$Ga$_{1-X}$As layer 24 is also provided for the same purpose, but X decreases with position toward the top of the layer. Layers 20, 22 and 24 serve as an emitter region, and layer 26 serve as an emitter-cap layer.

Using the thus formed epitaxial wafer, first, element-isolation insulating layers 28 reaching substrate 10 are formed by implantation of H+ ions, and electrode-isolation insulating layers 30 reaching n+ type GaAs layer 12 within the transistor are formed by implantation of B+ ions. Using a predetermined mask, the semiconductor layers are selectively etched up to a depth to reach p+ type GaAs layer 18, thus exposing the base. Subsequently, a CVDSiO$_2$ layer 32 is formed over the entire surface. To provide an electrode contact to the collector region, selective etching is carried out from the wafer surface up to a depth to reach layer 12. A thin layer of AuGe is formed in the etched portion, and a layer of Au is then formed on the AuGe layer to provide a collector electrode 34. Further, contact holes are formed for the emitter and base regions to provide emitter and base electrodes 36 and 38 of AuGe layer.

Using a transistor having the same structure as the thus formed heterojunction bipolar transistor, the collector transit time was calculated by means of Monte Carlo simulation. The result was about 0.7 psec. This is substantially the same as that of the heterojunction bipolar transistor of the first embodiment having p−-n−-n+ type collector which does not involve intrinsic semiconductor layer 50 of 500 Å. The collector junction capacitance is $7.04\times 10^{-8}$ F/cm$^2$ for the transistor of the first embodiment which does not include intrinsic semiconductor layer 50, while it is $6.68\times 10^{-8}$ F/cm$^2$ for the transistor of this embodiment which introduced intrinsic semiconductor layer 50 of 500 Å. With this embodiment, the capacitance could be reduced by about 5%.

The rate of improvement in the collector junction capacitance of the third embodiment might be considered small. However, this is perhaps because the impurity concentrations and the thicknesses of the layers are not necessarily set to optimum values. By properly choosing these parameters, it would be possible to make the collector capacitance still smaller.

Although the preferred embodiments of this invention have been disclosed and described, it is apparent that other embodiments and modifications are possible.

What is claimed is:

1. A heterojunction bipolar transistor comprising:
   a first semiconductor layer of a first conductivity type;
   a second semiconductor layer of the first conductivity type formed on said first semiconductor layer;
   a third semiconductor layer of a second conductivity type formed on said second semiconductor layer, said first, second and third semiconductor layers serving as a collector;
   a fourth semiconductor layer of said second conductivity type formed on said third semiconductor layer, said fourth semiconductor layer serving as a base; and
   a fifth semiconductor layer of the first conductivity type formed on said fourth semiconductor layer, said fifth semiconductor layer serving as an emitter, said fourth and fifth semiconductor layers together forming a heterojunction, and said fifth semiconductor layer having a larger band gap than said fourth semiconductor layer;
   wherein said first, second, third and fourth semiconductor layers are related as follows:

$$N_1 > N_2 \geqq N_3$$

$$N_3 < N_4$$

$$\left(\frac{2\epsilon V_{bi}}{e} \cdot \frac{N_2}{N_3(N_3 + N_2)}\right)^{\frac{1}{2}} < W_3$$

where $N_1$, $N_2$, $N_3$, and $N_4$ are impurity concentrations of said first, second, third, and fourth semiconductor layers, respectively, e is the unit charge, $\epsilon$ is the dielectric constant of said collector, $V_{bi}$ is the built-in potential between said second and third semiconductor layers, and $W_3$ is the thickness of said third semiconductor layer.

2. A transistor according to claim 1, wherein the impurity concentration $N_3$ of said third semiconductor layer decreases from the side of said fourth semiconductor layer toward the side of said second semiconductor layer.

3. A heterojunction bipolar transistor comprising:
   a first semiconductor layer of a first conductivity type;
   a second semiconductor layer of the first conductivity type formed on said first semiconductor layer;
   a third semiconductor layer of a second conductivity type formed on said second semiconductor layer, said first, second and third semiconductor layers serving as a collector;
   a fourth semiconductor layer of the second conductivity type formed on said third semiconductor layer, said fourth semiconductor layer having an intrinsic base region serving as a base, and an external base region formed to surround said intrinsic base region; and
   a fifth semiconductor layer of the first conductivity type formed on said fourth semiconductor layer, said fifth semiconductor layer serving as an emitter, said fourth and fifth semiconductor layers together forming a heterojunction, and said fifth semiconductor layer having a larger band gap than said fourth semiconductor layer;
   wherein said second and third semiconductor layers formed below the external base region are formed to have high resistivity; and
   wherein said first, second, third and fourth semiconductor layers are related as follows:

$$N_1 > N_2 \geqq N_3$$

$$N_3 < N_4$$

-continued $$\left(\frac{2\epsilon V_{bi}}{e} \cdot \frac{N_2}{N_3(N_3 + N_2)}\right)^{\frac{1}{2}} < W_3$$

$W_2 > W_3$ where $N_1$, $N_2$, $N_3$, and $N_4$ are impurity concentrations of said first, second, third, and fourth semiconductor layers, respectively, e is the unit charge, $\epsilon$ is the dielectric constant of said collector, $V_{bi}$ is the built-in potential between said second and third semiconductor layers, $W_2$ is the thickness of said second semiconductor layer, and $W_3$ is the thickness of said third semiconductor layer.

4. A transistor according to claim 3, wherein the impurity concentration $N_3$ of said third semiconductor layer decreases from the side of said fourth semiconductor layer toward the side of said second semiconductor layer.

5. A heterojunction bipolar transistor comprising:
a first semiconductor layer of a first conductivity type;
a second semiconductor layer of the first conductivity type formed on said first semiconductor layer;
a third undoped semiconductor layer formed on said second semiconductor layer;
a fourth semiconductor layer of a second conductivity type formed on said third semiconductor layer, said first, second, third and fourth semiconductor layers serving as a collector;
a fifth semiconductor layer of the second conductivity type formed on said fourth semiconductor layer, said fifth semiconductor layer serving as a base; and
a sixth semiconductor layer of the first conductivity type formed on said fifth semiconductor layer, said fifth and sixth semiconductor layers together forming a heterojunction, and said sixth semiconductor layer having a larger band ga than said fifth semiconductor layer;
wherein said first, second, fourth and fifth semiconductor layers are related as follows:
$N_1 > N_2$
$N_4 < N_5$
where $N_1$, $N_2$, $N_4$, and $N_5$ are impurity concentrations of said first, second, fourth, and fifth semiconductor layers, respectively.

6. A transistor according to claim 5, wherein the impurity concentration $N_4$ of said fourth semiconductor layer decreases from the side of said fifth semiconductor layer toward the side of said third semiconductor layer.

* * * * *